United States Patent [19]
Bodin

[11] Patent Number: 6,091,022
[45] Date of Patent: Jul. 18, 2000

[54] HIGH PRESSURE HEADER FOR A SEMICONDUCTOR PRESSURE TRANSDUCER

[75] Inventor: Joel J. Bodin, Chanhassen, Minn.

[73] Assignee: Honeywell Inc., Morristown, N.J.

[21] Appl. No.: 09/213,501

[22] Filed: Dec. 17, 1998

[51] Int. Cl.[7] .................................................. H01L 23/02
[52] U.S. Cl. ........................................ 174/52.5; 257/708
[58] Field of Search ............................ 174/52.5; 257/697, 257/732, 733, 708, 699

[56] References Cited

U.S. PATENT DOCUMENTS

| | | | |
|---|---|---|---|
| 3,817,107 | 6/1974 | Shimada et al. | 73/727 |
| 4,040,297 | 8/1977 | Karsmakers et al. | 73/725 |
| 4,063,057 | 12/1977 | Meisenheimer, Jr. | 200/838 |
| 4,088,381 | 5/1978 | Harnett | 439/190 |
| 4,486,622 | 12/1984 | Dathe et al. | 174/52.5 |
| 4,746,893 | 5/1988 | Shak | 338/5 |
| 4,764,747 | 8/1988 | Kurtz et al. | 338/2 |
| 5,522,267 | 6/1996 | Lewis | 73/726 |

*Primary Examiner*—Dean A. Reichard
*Assistant Examiner*—Hung V Ngo
*Attorney, Agent, or Firm*—Kris T. Fredrick

[57] ABSTRACT

A header structure for a semiconductor pressure transducer includes a cylindrical glass member located within a tubular housing having a closed end. A tubular core member extends through a central axial hole in the glass member. The core member has a sealed end proximate the closed end of the housing and an opposite end. A plurality of electrically conductive terminal pins extend through the glass member in surrounding relation to the core member and exit the housing through a plurality of holes in the closed end. A semiconductor die is mounted adjacent the opposite end of the core member and is electrically connected to the surrounding terminal pins by wire leads.

6 Claims, 2 Drawing Sheets

SECTION C-C

SECTION A-A

SECTION C-C 6,091,022

HIGH PRESSURE HEADER FOR A SEMICONDUCTOR PRESSURE TRANSDUCER

CROSS REFERENCE TO RELATED APPLICATIONS (IF ANY)

Not applicable.

U.S. GOVERNMENT RIGHTS (IF ANY)

Not applicable.

BACKGROUND OF THE INVENTION

1. Field of the invention

The present invention relates generally to headers for pressure transducers and particularly to headers for semiconductor pressure transducers suitable for high pressure applications.

2. Description of the Prior Art

Semiconductor pressure transducers are presently used in a variety of applications and are well known in the art. Such devices typically employ piezoresistive elements formed on the surface of a thin semiconductor die. The semiconductor die is mounted over an open chamber and is deflected into and out of the chamber in response to a pressure differential on its opposite planar surfaces. A change in resistance is exhibited by the piezoresistive elements in response to the deflection, whereby a signal indicative of the pressure differential is generated.

The semiconductor die is typically mounted in a header structure which serves both to isolate the semiconductor die from external stresses and to contain the pressure to be measured. Wire leads electrically connect the semiconductor die to surrounding terminal pins which extend through the header structure for connection to external electronics.

A common problem of semiconductor pressure transducers has been the sealing of the terminal pins passing through the header structure. For high pressure applications, the semiconductor die is typically mounted in a metal housing. A number of through holes are drilled in the metal housing surrounding the semiconductor die and within each hole is located an electrically conductive terminal pin. An independent glass seal is provided around each terminal pin in order to form a fluid-tight seal between the peripheral surface of the terminal pin and the interior surface of the hole. The glass seal also serves to electrically insulate the terminal pin from the metal housing.

The holes provided in the metal housing for the passage of the terminal pins are typically relatively small in diameter so that the surface area of the glass seals subjected to a pressure force is correspondingly small. The header structure is thus able to withstand high pressures without the likelihood of failure of the glass seals.

The process of drilling long, small diameter holes through the metal housing, however, adds significantly to the manufacturing cost of the header structure. In addition, the terminal pins must be located a sufficient distance apart from one another to allow for the glass seals surrounding the terminal pins. The size of the header is thereby increased, and the terminal pins are required to be located a considerable distance from the sensor die.

Thus a need exists for a header structure that does not require an independent glass seal surrounding each terminal pin and yet is suitable for high pressure applications.

BRIEF SUMMARY OF THE INVENTION

The present invention solves these and other needs by providing a header structure for a semiconductor pressure transducer having all of the terminal pins embedded in a unitary cylindrical glass member. The glass member is located within a tubular housing having a closed end. A tubular core member extends through a central axial hole in the glass member. The core member has a sealed end proximate the closed end of the housing and an opposite end. A plurality of electrically conductive terminal pins extend through the glass member in surrounding relation to the core member and exit the housing through a plurality of holes in the closed end. A semiconductor die is mounted adjacent the opposite end of the core member and is electrically connected to the surrounding terminal pins by wire leads.

DETAILED DESCRIPTION OF THE INVENTION

Figure 1:
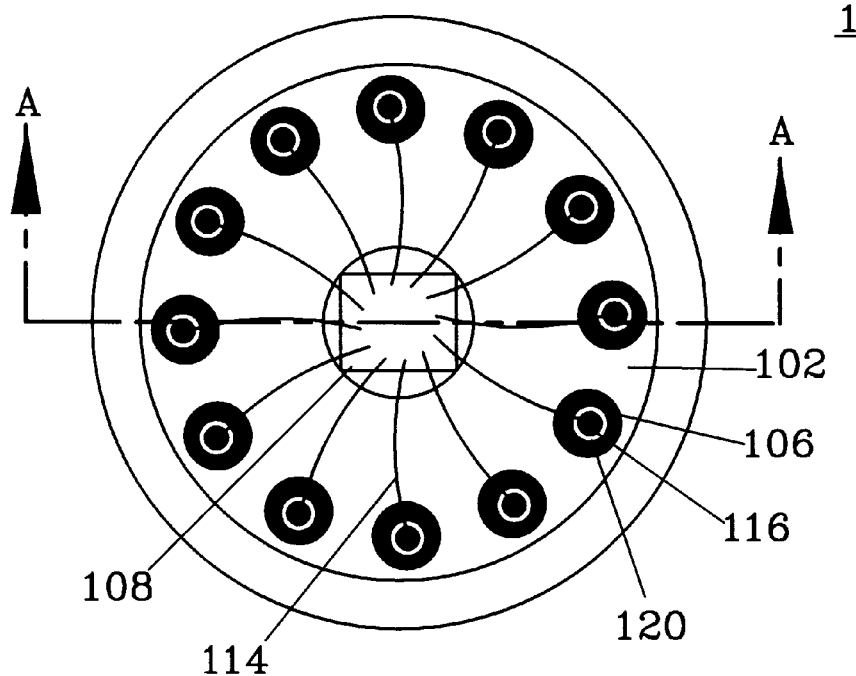
FIG. 1 is a top plan view of a prior art header structure for a semiconductor pressure transducer.
Figure 2:
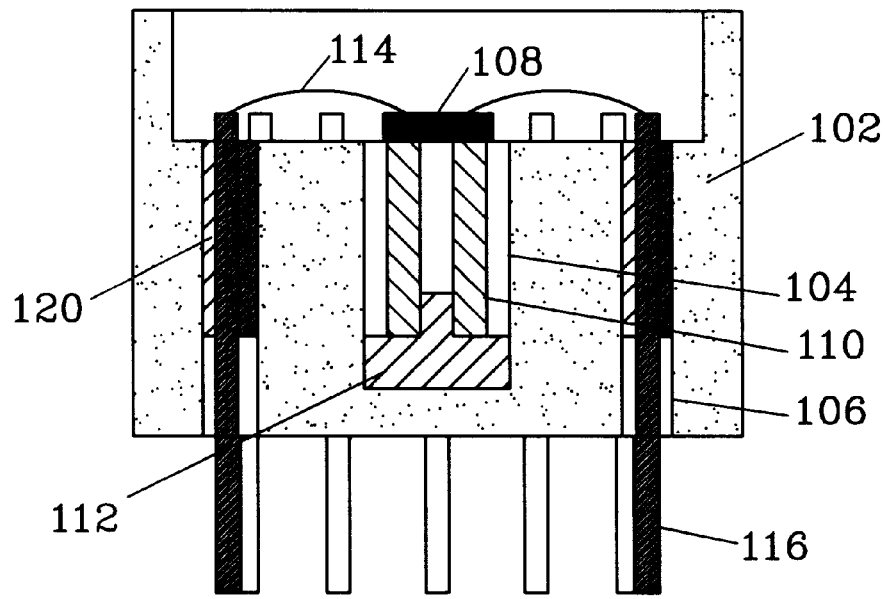
FIG. 2 is a cross-sectional view of the prior art header structure of FIG. 1 along section line A—A.

A prior art header structure 100 for a semiconductor pressure transducer of a type suitable for high pressure applications is illustrated in FIGS. 1 and 2.

Prior art header 100 includes a metal housing 102 having a deep axial counter bore 104 and a plurality of through holes 106 surrounding counter bore 104. A semiconductor die 108 having piezoresistive elements formed thereon is mounted on one end of a glass support tube 110. Support tube 110 is attached at an opposite end to a base member 112 located in counter bore 104. Semiconductor die 108 is connected by wire leads 114 to a plurality of electrically conductive terminal pins 116 that extend through housing 102. An independent glass seal 120 is provided around each terminal pin 116.

The manufacturing cost of prior art header 100 is significantly increased by the necessity of drilling long through holes 106 and deep counter bore 104 in housing 102. In addition, terminal pins 116 must be located a sufficient distance apart from one another to allow for glass seals 120. When a substantial number of terminal pins are required, the diameter of housing 102 must be increased. Terminal pins 116 must be located farther away from semiconductor die 108 and the wire bonding of semiconductor die 108 is made more difficult.

Figure 3:
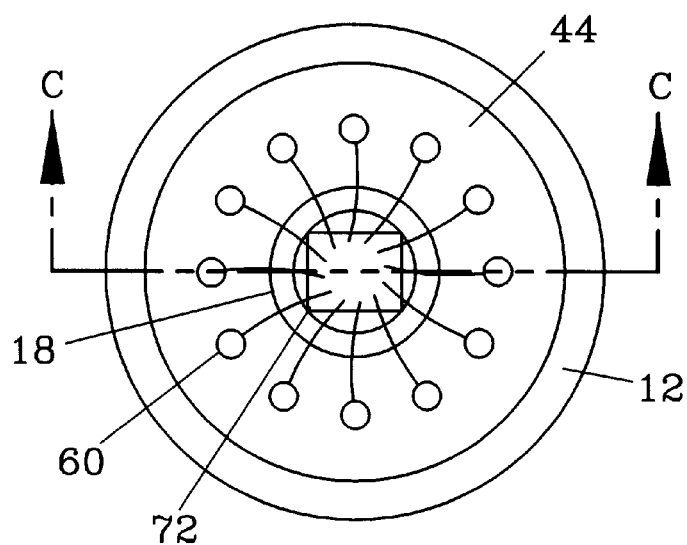
FIG. 3 is a top plan view of a header structure in accordance with the principles of the present invention.
Figure 4:
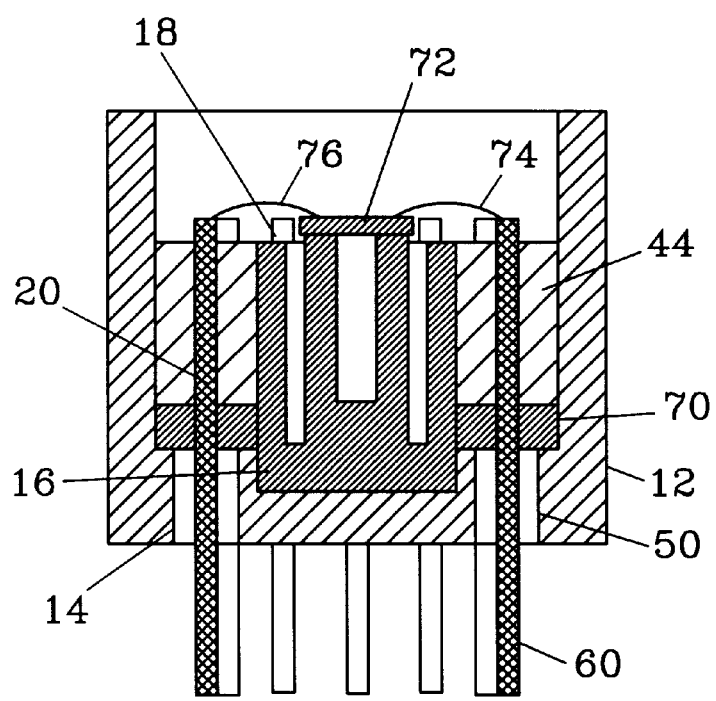
FIG. 4 is a cross-sectional view of the header structure of FIG. 3 along section line C—C.

A header structure in accordance with the principles of the present invention is illustrated in FIGS. 3 and 4 and is generally designated 10.

Header 10 includes a tubular metal housing 12 having a closed end 14. Closed end 14 is provided with a shallow axial counter bore 16 and a plurality of through holes 50 surrounding counter bore 16. A tubular core member 18 is received at one end by counter bore 16 and is brazed to an interior surface of counter bore 16 to form a fluid-tight seal therewith. A base member 20 rests in counter bore 16 and is brazed to an interior surface of core member 18.

A cylindrical glass member 44 is positioned in housing 12 against closed end 14. Glass member 44 has an axial hole through which core member 18 extends. Glass member 44 is further provided with a plurality of through holes in register with holes 50 in closed end 14. Electrically conductive terminal pins 60 are positioned in each hole to extend slightly above the surface of glass member 44 and exit housing 12 through holes 50 in closed end 14.

Terminal pins 60 are hermetically sealed in housing 12 by the formation of glass-to-metal compression seals. The coefficients of thermal expansion of the materials from which the various components of the header structure are fabricated are intentionally mismatched with respect to one another so that, when thermal energy is applied to the header and subsequently removed, the materials contract at different rates during cooling. Hermetic seals are formed by the compressive forces between the various components of the header structure resulting from the dissimilar rates of contraction.

In order to generate the required compressive forces, it is necessary to fabricate housing 12 from a material having a coefficient of thermal expansion substantially greater than that of glass member 44. The interior components of the header, including core member 18, base member 20 and terminal pins 60, are fabricated from materials having coefficients of thermal expansion less than that of glass member 44.

Housing 12 is preferably made from stainless steel. Glass member 44 may be fabricated from a compression-type glass such as that sold by Coring Inc. under the trade name CORNING 9013. Core member 18, base member 20, and terminal pins 60 are preferably fabricated from a nickel-iron alloy such as ALLOY 52.

Header 10 is heated to a sufficient temperature to at least partially liquefy glass member 44. During cooling, housing 12 contracts at a greater rate than glass member 44 as a result of its greater coefficient of thermal expansion. Glass member 44, in turn, contracts at a greater rate than core member 18 and terminal pins 60.

As a consequence of the dissimilar rates of contraction, large radial compressive forces are generated in the header structure. The compressive forces are of such a magnitude that a hermetic seal is formed between the inner surface of housing 12 and the outer peripheral surface of glass member 44. Hermetic seals are similarly formed between glass member 44 and the outer peripheral surfaces of core member 18 and terminal pins 60.

Glass member 44 is supported not only by the radial compressive forces acting upon it, but also by closed end 14. Header 10 is therefore able to withstand significant pressure forces acting in the direction of its axis. Since closed end 14 serves merely to provide axial support to glass member 44, and glass seals need not be provided in holes 50, closed end 14 can generally be relatively thin. The cost of drilling holes 50 in housing 12 is therefore reduced.

Because of the substantially greater rate of contraction of housing 12 relative to glass member 44, significant shear stresses may be generated during cooling at the interface of glass member 44 and closed end 14. In order to reduce the possibility of crack formation in glass member 44, it may be desirable to position a washer 70 between glass member 44 and closed end 14, as shown in FIG. 4. Washer 70 is provided with a plurality of through holes in register with holes 50 in closed end 14 and is preferably fabricated from a ceramic material having a coefficient of thermal expansion similar to that of glass member 44. The ceramic material should have a higher melting temperature than glass member 44 so that washer 70 is not liquefied when the header structure is heated.

A semiconductor die 72 is positioned in housing 12 after the header structure has fully cooled. Semiconductor die 72 is mounted by conventional anodic bonding techniques across one end of a support tube 74 fabricated from PYREX or a similar borosilicate glass. Support tube 74 is attached at an opposite end to base member 20. A portion of base member 20 extends into support tube 74 and is attached to an interior surface of support tube 74 with epoxy or other bonding agent. Semiconductor die 72 is electrically connected to terminal pins 60 by gold wire leads 76.

A fluid-tight seal is formed by the anodic bonding of semiconductor die 72 to support tube 74. To measure absolute pressure, support tube 74 may be evacuated and a second fluid tight seal formed between support tube 74 and base member 20. In the alternative, a glass plug may be used to seal an evacuated chamber in support tube 74 as described in U.S. Pat. No. 4,888,992, dated Dec. 26, 1989 and assigned to the same assignee as the present application.

To measure differential pressure, a fluid-tight seal may similarly be formed between support tube 74 and base member 20. A hole (not shown) may be provided through housing 12 at the bottom of counter bore 16 and through base member 20 to allow an external or atmospheric pressure into support tube 74.

The header structure of the present invention does not require an independent glass seal surrounding each terminal pin as is typical in prior art headers suitable for high pressure applications. The terminal pins can therefore be located closer to one another. The size of the header structure is reduced and wire bonding is facilitated because the terminal pins can be located closer to the semiconductor die.

Since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A header structure for a semiconductor pressure transducer, comprising:

a tubular housing having a closed end;

a cylindrical glass member located within said housing in sealing peripheral contact with an interior surface of said housing, said glass member having an axial hole through the center thereof;

a tubular core member extending through said axial hole in sealing peripheral contact with an interior surface of said axial hole, said core member having a sealed end and an opposite end, said sealed end proximate said closed end of said housing;

a plurality of electrically conductive terminal pins extending through said glass member in surrounding relation to said core member and exiting said housing through a plurality of holes in said closed end;

a semiconductor die;

means for mounting said semiconductor die adjacent said opposite end;

wire leads electrically connecting said semiconductor die to said terminal pins.

2. Header structure of claim 1 further comprising a washer located in said housing between said glass member and said closed end, said washer having a plurality of holes in register with said holes in said closed end.

3. Header structure of claim 1 wherein said housing is fabricated from a material having a coefficient of thermal expansion greater than that of said glass member.

4. Header structure of claim 1 wherein said glass member is fabricated from a material having a coefficient of thermal expansion greater than that of said core member.

5. Header structure of claim 1 wherein said glass member is fabricated from a material having a coefficient of thermal expansion greater than that of said terminal pins.

6. Header structure of claim 2 wherein said washer is fabricated from a material having a coefficient of thermal expansion similar to that of said glass member.

* * * * *